(12) United States Patent
Takahashi

(10) Patent No.: US 7,795,941 B2
(45) Date of Patent: Sep. 14, 2010

(54) FRAME PULSE SIGNAL LATCH CIRCUIT AND PHASE ADJUSTMENT METHOD

(75) Inventor: Tsugio Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 30 days.

(21) Appl. No.: 12/391,449

(22) Filed: Feb. 24, 2009

(65) Prior Publication Data

US 2009/0212836 A1  Aug. 27, 2009

(30) Foreign Application Priority Data

Feb. 26, 2008  (JP) ............................. 2008-044017

(51) Int. Cl.
*H03H 11/26* (2006.01)
(52) U.S. Cl. ...................... 327/261; 327/291
(58) Field of Classification Search ................ 327/291, 327/293, 294, 164–166, 261
See application file for complete search history.

(56) References Cited

U.S. PATENT DOCUMENTS 6,075,393 A * 6/2000 Tomita et al. ............... 327/153
6,188,258 B1 * 2/2001 Nakatani ..................... 327/157
6,937,082 B2 * 8/2005 Ishimi ......................... 327/291
7,391,255 B2 * 6/2008 Matsuzaki ................... 327/565

FOREIGN PATENT DOCUMENTS

JP  1993292343 A  11/1993
JP  1994303226 A  10/1994

* cited by examiner

*Primary Examiner*—Hai L Nguyen

(57) ABSTRACT

A frame pulse signal latch circuit has: a pulse-width expanding unit which outputs a frame pulse signal FPIN having a pulse width longer than a m-clock cycle; a phase adjustment unit which generates a phase-adjusted output clock CLK'; a flip-flop which latches the frame pulse signal FPIN; a racing detection unit which generates signals, which are shifted by one to m clocks with respect to a frame pulse signal FPOUT, and detects a racing state based on a result of an AND operation of the frame pulse signal FPOUT and the clock-shifted signals; and a control unit which sequentially selects and directs different phase adjustment amounts to the phase adjustment unit, determines an optimal phase adjustment amount based on a worst phase adjustment amount of the case in which the racing state is detected, and gives a direction about the optimal phase adjustment amount to the phase adjustment unit.

11 Claims, 15 Drawing Sheets

FIG.13A FP

FIG.13B GOUT

FIG.13C FPIN

OUTPUT DATA WIDTH

FRAME PULSE SIGNAL LATCH CIRCUIT AND PHASE ADJUSTMENT METHOD

This application is based on Japanese Patent Application No. 2008-044017 filed on Feb. 26, 2008 and including specification, claims, drawings and summary. The disclosure of the above Japanese Patent Application is incorporated herein by reference in its entirety.

BACKGROUND OF THE INVENTION

1. Field of the Invention

The present invention relates to a frame pulse signal latch circuit which latches a frame pulse signal repeatedly transmitted at a constant pulse width and, in particular, to a frame pulse signal latch circuit and a phase adjustment method readily enabling evaluation and adjustment of latch timing.

2. Description of the Related Art

Along with increase of the integration degree and the processing speed of an electronic circuit, the frequency of a system clock used in control of the electronic circuit is increasing. Accordingly, when digital signals are to be transferred between printed wiring boards or devices, the permissible errors about the phase variation of the digital signals are becoming stricter.

Generally, when a digital signal is to be transferred by using clocks, for example, when a frame pulse signal or the like which is cyclically varied is to be transferred, synchronization clocks having a high frequency is transmitted from a transmitting side in parallel with the frame pulse signal. Then, when the frame pulse signal is latched by using the clocks in a receiving side, a frame pulse signal synchronized with the clocks is generated.

In a latch circuit which latches the frame pulse signal, when a variation point of the frame pulse signal and the latch timing according to the clock are overlapped with each other, a racing state that the time position of the latched frame pulse signal is varied forward or backward by the period corresponding to one clock is generated. In this case, the latch circuit can no longer generate the frame pulse signal having the original cycle.

Therefore, various adjustment methods for reliably latching the frame pulse signal by optimizing the phase of the clocks in the receiving side have been proposed (for example, see Unexamined Japanese Patent Application KOKAI Publication No. H05-292343 and Unexamined Japanese Patent Application KOKAI Publication No. H06-303226).

However, in the conventional adjustment methods, the process carried out until an optimal phase point is found is complicated, and long time is taken for adjustment as a result, which is a problem. Moreover, since the optimal phase point has been sensuously determined by judgment of engineers, automating the adjustment has been difficult.

In a latch circuit, in order to shorten the time taken until the phase is optimized, the shorter the wiring length of the printed wiring board, the better. Therefore, designing of a printed wiring board of a latch circuit is generally difficult. Furthermore, the higher the frequency of the system clocks, the stricter the phase errors permitted in the printed wiring board. Therefore, it is expected that designing of printed wiring boards, examination of the quality of printed wiring boards, etc. will be further difficult in the future.

SUMMARY OF THE INVENTION

The present invention has been accomplished in order to solve the above described problems, and it is an object of the present invention to provide a frame pulse signal latch circuit and a phase adjustment method which readily and automatically enabling adjustment of latch timing.

A frame pulse signal latch circuit of the present invention has: a pulse-width expanding unit which Outputs a frame pulse signal which is obtained by expanding a pulse width of an input frame pulse signal which has the pulse width of an m (m is a positive integer)-clock cycle to a pulse width which is longer than the m-clock cycle; a phase adjustment unit which generates an output clock by adjusting a phase of an input clock based on a directed phase adjustment amount; a first latch unit which obtains an output frame pulse signal by latching the frame pulse signal, which is output from the pulse-width expanding unit, in synchronization with the output clock; a racing detection unit which generates signals including a signal shifted by one clock to a signal shifted by m clocks with respect to the output frame pulse signal and detects a racing state, which is generated in the output frame pulse due to a phase relation between the frame pulse signal, which is output from the pulse-width expanding unit, and the output clock, based on a result of an AND operation of the output frame pulse signal and the signals including the one-clock shifted signal to the m-clock shifted signal; and a control unit which sequentially selects and directs different phase adjustment amounts to the phase adjustment unit, determines an optimal phase adjustment amount based on a worst phase adjustment amount of the case in which the racing state is detected by the racing detection unit, and gives a direction about the optimal phase adjustment amount to the phase adjustment unit.

The racing detection unit may comprise an m-unit of a second latch unit which generates the signals including the one-clock shifted signal to the m-clock shifted signal with respect to the output frame pulse signal of the first latch unit; and an AND operation unit which carries out an AND operation of the output frame pulse signal and the signals including the one-clock shifted signal to the m-clock shifted signal.

The control unit may set a phase adjustment amount, which is shifted by 180 degrees from the worst phase adjustment amount, as the optimal phase adjustment amount.

The frame pulse signal output from the pulse-width expanding unit may be a frame pulse signal having a minimum length which can be latched by a (m+1) clocks.

The pulse-width expanding unit may comprise a buffer to which the input frame pulse signal is input.

The pulse-width expanding unit may comprise a delay gate which delays the input frame pulse signal; and a logical addition unit which carries out a logical addition of the output of the delay gate and the input frame pulse signal.

The pulse-width expanding unit may comprise a differential buffer having an input terminal to which the input frame pulse signal is input and another input terminal to which a threshold voltage is input.

A phase adjustment method of a frame pulse signal latch circuit of the present invention includes: a pulse-width expanding procedure of outputting a frame pulse signal which is obtained by expanding a pulse width of an input frame pulse signal which has the pulse width of an m (m is a positive integer)-clock cycle to a pulse width which is longer than the m-clock cycle; a phase adjustment procedure of generating an output clock adjusting a phase of an input clock based on a directed phase adjustment amount by a phase adjustment unit; a first latch procedure of obtaining an output frame pulse signal by latching the frame pulse signal, which is output in the pulse-width expanding procedure, in synchronization with the output clock; a racing detection procedure of generating signals including a signal shifted by one clock to a signal shifted by in clocks with respect to the output frame pulse signal and detecting a racing state, which is generated in the output frame pulse due to a phase relation between the frame pulse signal, which is output in the pulse-width expanding procedure, and the output clock, based on a result of an AND operation of the output frame pulse signal and the signals including the one-clock shifted signal to the m-clock shifted signal; and a control procedure of sequentially selecting and directing different phase adjustment amounts to the phase adjustment unit, determining an optimal phase adjustment amount based on a worst phase adjustment amount of the case in which the racing state is detected in the racing detection procedure, and giving a direction about the optimal phase adjustment amount to the phase adjustment unit.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Figure 1:
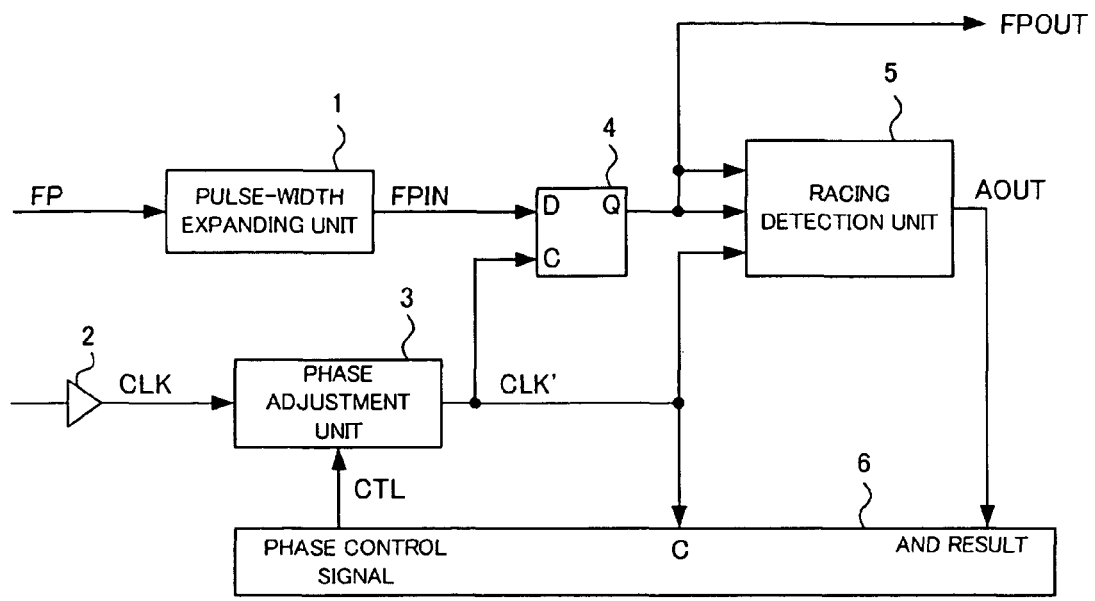
FIG. 1 is a block diagram showing a configuration of a frame pulse signal latch circuit according to a first embodiment of the present invention.

Hereinafter, embodiments of the present invention will be explained with reference to drawings. FIG. 1 is a block diagram showing a configuration of a frame pulse signal latch circuit according to a first embodiment of the present invention.

The frame pulse signal latch circuit of the present embodiment has a pulse-width expanding unit 1, a buffer 2, a phase adjustment unit 3, a flip-flop 4, a racing detection unit 5, and a control unit 6.

The pulse-width expanding unit 1 receives an input frame pulse signal FP, which has a pulse width of an m (m is a positive integer)-clock cycle, from a transmitting side and outputs a frame pulse signal FPIN which is obtained by extending the pulse width of the frame pulse signal FP to be longer than the m-clock cycle.

The buffer 2 receives clocks from the transmitting side.

The phase adjustment unit 3 generates output clocks CLK', which are obtained by adjusting the phase of input clocks CLK based on a directed phase adjustment amount.

The flip-flop 4 is a latch unit, which obtains an output frame pulse signal FPOUT by latching the frame pulse signal FPIN, which is output from the pulse-width expanding unit 1, in synchronization with the output clocks CLK'.

The racing detection unit 5 generates signals including a signal that is shifted by one clock with respect to the output frame pulse signal FPOUT and a signal that is shifted by m clocks therefrom. Then, based on the results of an AND operation of the output frame pulse signal FPOUT and the signals which are shifted by 1 to m clocks, the racing state, which is generated in the output frame pulse FPOUT due to the phase relation between the frame pulse signal FPIN output from the pulse-width expanding unit 1 and the output clocks CLK', is detected.

The control unit 6 sequentially selects different phase adjustment amounts and gives direction about them to the phase adjustment unit 3. Based on the phase adjustment amount (worst phase adjustment amount) of the case in which the racing state is detected by the racing detection unit 5, the control unit 6 determines an optimal phase adjustment amount and gives a direction about it to the phase adjustment unit 3.

In the present embodiment, the phase adjustment amount with respect to the clocks CLK in the phase adjustment unit 3 is sequentially varied so as to detect the racing state. Then, based on the worst phase adjustment amount of the point, the optimal phase adjustment amount by which the frame pulse signal FPIN can be stably latched is determined.

Figure 2:
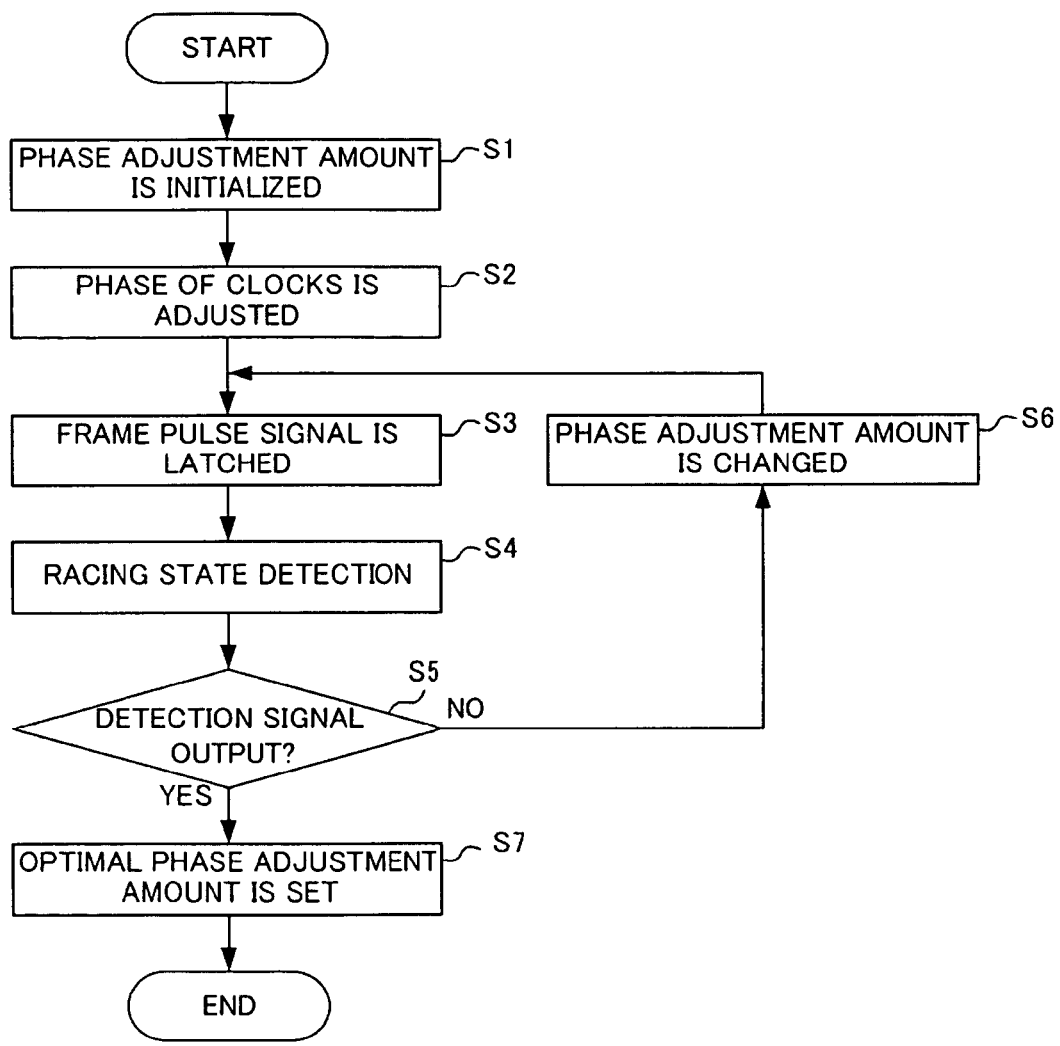
FIG. 2 is a flow chart showing an operation of the case of phase adjustment of the frame pulse signal latch circuit of FIG. 1.

Next, an operation of the frame pulse signal latch circuit of the present embodiment will be explained. FIG. 2 is a flow chart showing an operation of the case of phase adjustment of the frame pulse signal latch circuit.

The frame pulse signal FPIN is a signal having a pulse width that is slightly longer than the pulse width of the original frame pulse signal FP (in other words, ni-clock cycle). The frame pulse signal FPIN slightly longer than the m-clock cycle means a frame pulse signal having a minimum length which can be latched by (m+1) clocks. An actual length of the frame pulse signal FPIN is longer than the minimum length, which can be latched by (m+1) clocks, by the amount of jitter of the clocks or by the amount of jitter of the frame pulse signal. Note that the pulse-width expanding unit 1 can be mounted in the transmitting side.

Corresponding to input of an initiation directing signal, which indicates initiation of a phase adjustment operation, the control unit 6 initializes the phase adjustment amount of the phase adjustment unit 3 to, for example, zero (step S1). As a result, the clocks CLK' having a zero phase adjustment amount with respect to the clocks CLK are output from the phase adjustment unit 3 (step S2).

The flip-flop 4 latches the frame pulse signal FPIN, which is output from the pulse-width expanding unit 1, in synchronization with the clocks CLK' and outputs the frame pulse signal FPOUT (step S3).

Subsequently, the racing detection unit 5 detects a racing state (step S4). The racing state is the state in which one frame pulse signal FPIN is latched (m+1) times by the flip-flop 4. Specifically, it is the state in which the rise/decay timing of the frame pulse signal FPIN and the rise timing of the clock CLK' are synchronized.

The control unit 6 determines whether a detection signal of an "H" level is output to output AOUT of the racing detection unit 5 or not (step 5). The determination herein is affirmed when the output AOUT is at the "H" level, and it is determined that the racing state is generated. Herein, the phase difference between the input clocks and the output clocks at the point when the racing state is generated is the phase adjustment amount directed to the phase adjustment unit 3 by the control unit 6. Hereinafter, the phase adjustment amount of the point when the racing state is generated will be referred to as a worst phase adjustment amount. When the determination herein is affirmed, the racing detection unit 5 determines that the phase adjustment amount is the worst phase adjustment amount.

When the output AOUT of the racing detection unit 5 is not at the "H" level, the control unit 6 changes the phase adjustment amount of the phase adjustment unit 3 by a predetermined unit amount (step S6) and returns to step S3. Thus, the process of steps S3 to S6 is repeated until the output AOUT of the racing detection unit 5 becomes at the "H" level.

Meanwhile, when the output AOUT of the racing detection unit 5 becomes at the "H" level (YES in step S5), the control unit 6 sets the phase adjustment amount, which is obtained by adding or subtracting the amount corresponding to half a cycle of the clock to or from the current phase adjustment amount (worst phase adjustment amount) directed to the phase adjustment unit 3, as an optimal phase adjustment amount. Then, a phase control signal CTL is output, thereby setting the phase adjustment amount of the phase adjustment unit 3 to the optimal phase adjustment amount (step S7). Thus, the phase adjustment operation is finished. Thereafter, the phase adjustment amount of the phase adjustment unit 3 is fixed to the optimal phase adjustment amount which has been set in this phase adjustment operation.

According to the present embodiment, the racing state is detected by the racing detection unit 5, and the phase adjustment amount of the phase adjustment unit 3 is set to the optimal phase adjustment amount based on the detection result. Therefore, the optimal phase of the clocks capable of reliably latching the frame pulse signal can be found in a short period of time. Moreover, in the present embodiment, the detection result clearly appears in the output of the racing detection unit 5. Therefore, phase adjustment is readily executed, and the phase adjustment can be automated. Moreover, in the present embodiment, the optimal phase can be reliably found. Therefore, the phase adjustment can be readily executed even for the printed wiring boards which have not been strictly designed. Furthermore, in the present embodiment, the optimal phase can be reliably found.

Therefore, a system which readily executes automatic adjustment even in a high-frequency zone can be realized.

Second Embodiment

Figure 3:
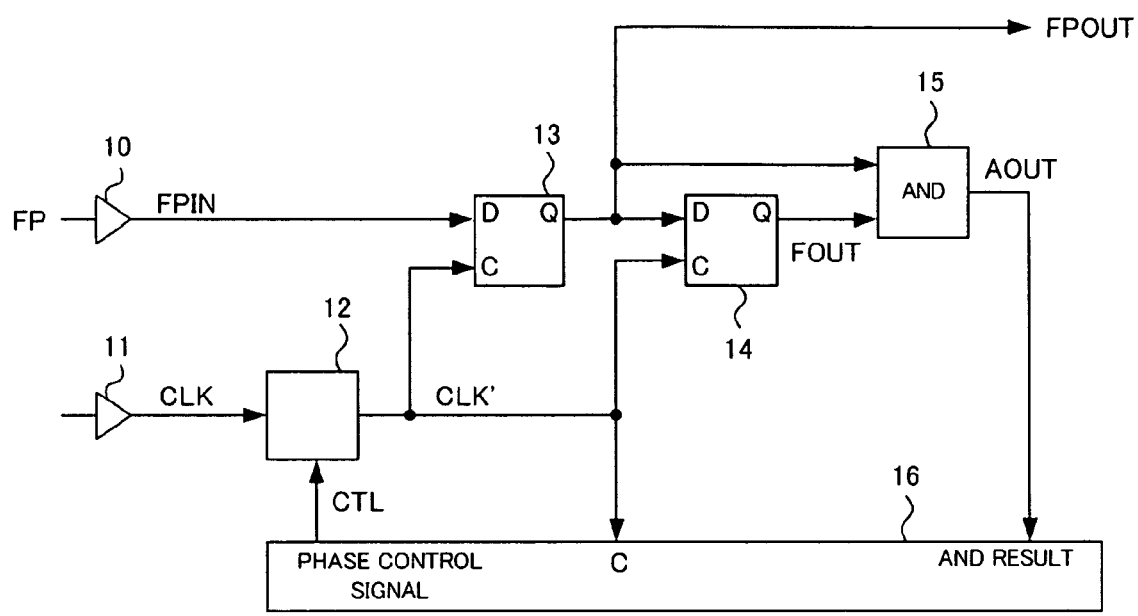
FIG. 3 is a block diagram showing a configuration of a frame pulse signal latch circuit according to a second embodiment of the present invention.
Figure 4:
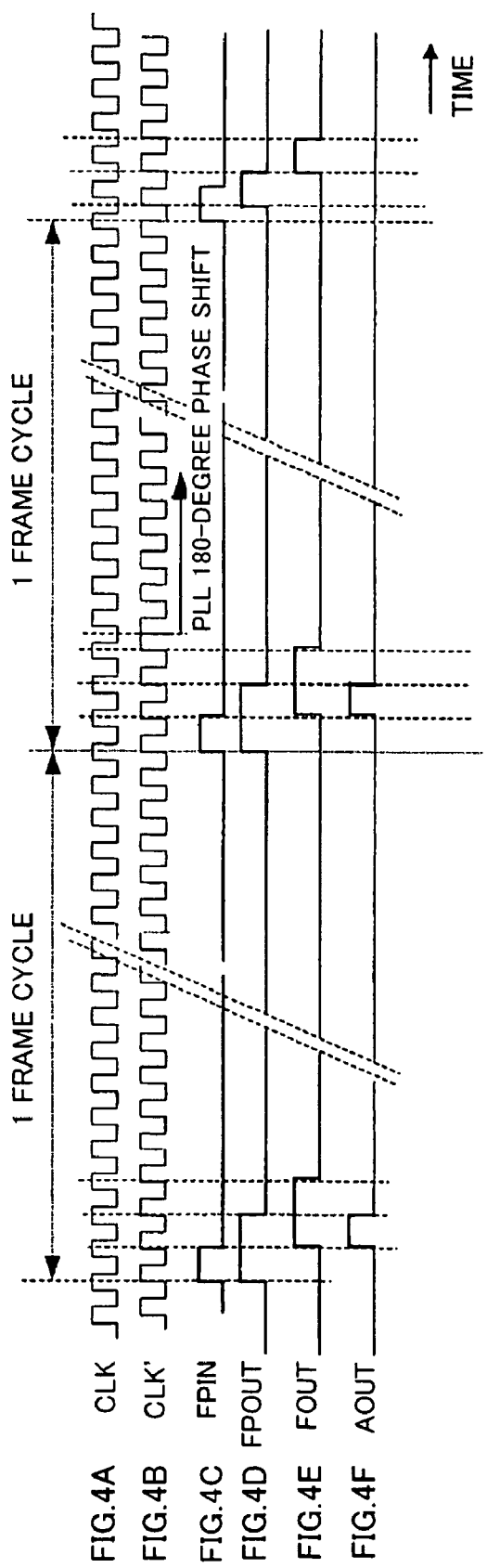
FIG. 4A to FIG. 4F are timing charts for explaining an operation of the case of phase adjustment of the frame pulse signal latch circuit of FIG. 3.
Figure 5:
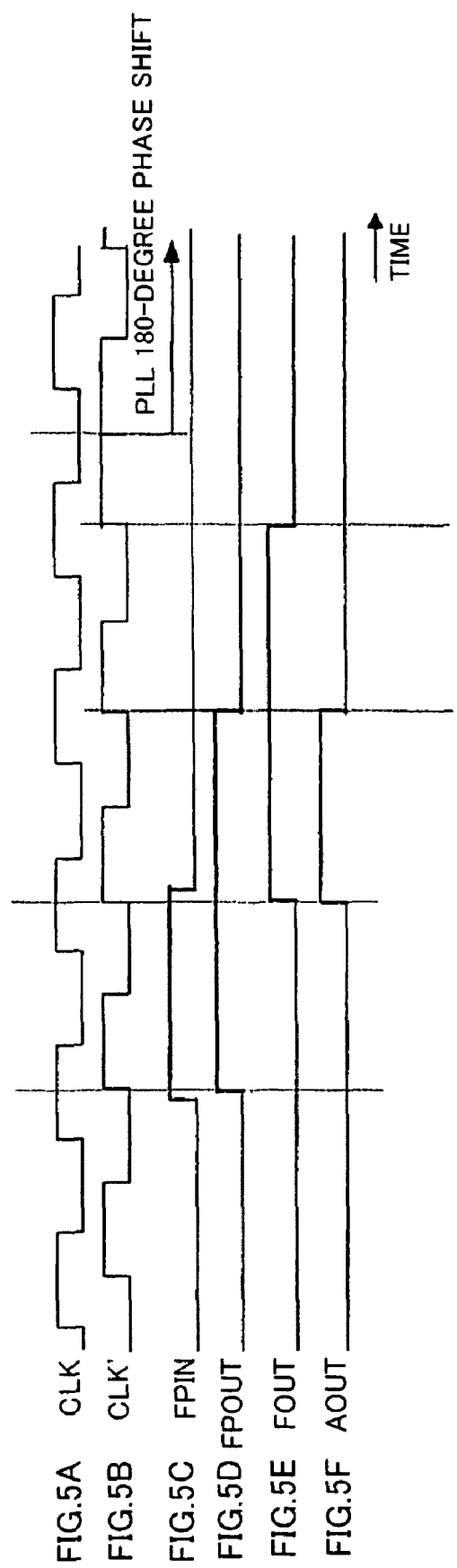
FIG. 5A to FIG. 5F are timing charts in which time of FIGS. 4A to 4F is enlarged.

Next, a second embodiment of the present invention will be explained. FIG. 3 is a block diagram showing a configuration of a frame pulse signal latch circuit according to the second embodiment of the present invention. The present embodiment explains the first embodiment in more detail. In the present embodiment, the pulse width of the frame pulse signal FP is a one-clock cycle.

The frame pulse signal latch circuit of the present embodiment has buffers 10 and 11, a PLL circuit 12, a flip-flop 13, a flip-flop 14, an AND circuit 15, and a control circuit 16.

The buffer 10 functions as the pulse-width expanding unit, which receives the frame pulse signal FP from the transmitting side. The buffer 11 receives clocks from the transmitting side.

The PLL circuit 12 functions as the phase adjustment unit which adjusts the phase of the clocks CLK output from the buffer 11 and outputs the clocks CLK' which has been phase-adjusted.

The flip-flop 13 functions as the latch unit which latches the frame pulse signal FPIN, which is output from the buffer 10, in synchronization with the clocks CLK', which have been phase-adjusted in the PLL circuit 12, and outputs the frame pulse signal FPOUT.

The flip-flop 14 latches the frame pulse signal FPOUT, which is output from the flip-flop 13, in synchronization with the clocks CLK', which have been phase-adjusted in the PLL circuit 12.

The AND circuit 15 obtains an AND operation of the output FPOUT of the flip-flop 13 and the output FOUT of the flip-flop 14.

The control circuit 16 controls the phase adjustment amount of the PLL circuit 12 based on the output AOUT of the AND circuit 15. The flip-flop 14 and the AND circuit 15 constitute the racing detection unit.

The racing state herein means the state that, when a variation point of the frame pulse signal FPIN and latch timing by the clocks CLK are overlapped with each other, the time position of the latched output frame pulse signal FPOUT is varied forward or backward by the period corresponding to one clock and that the frame cycle of the frame pulse signal FPOUT is varied by the period corresponding to one clock.

The period in which the racing state is generated is often generated in the period around the rise timing of the clock, and the period length is as extremely short as 100 to 200 psec. This period is referred to as a racing generation range, and the periods other than the racing generation range are latch effective periods in which the input frame pulse signal FP can be stably latched.

Figure 6:
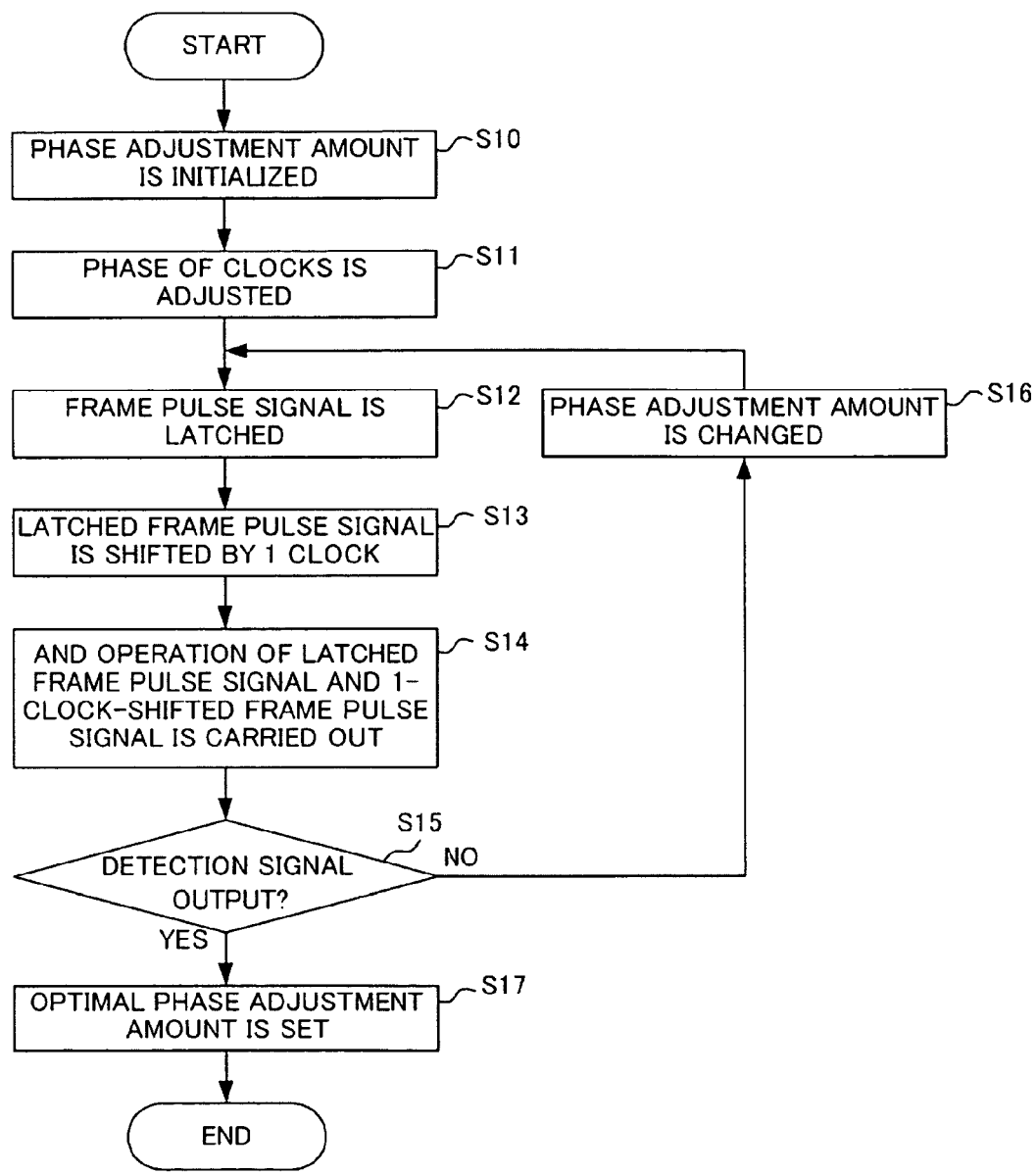
FIG. 6 is a flow chart showing the operation of the case of phase adjustment of the frame pulse signal latch circuit of FIG. 3.

Next, an operation of the frame pulse signal latch circuit of the present embodiment will be explained. FIG. 4A to FIG. 4F are timing charts for explaining the operation of the frame pulse signal latch circuit. FIG. 5A to FIG. 5F are timing charts showing the timing charts shown in FIG. 4A to FIG. 4F, respectively, in a partially enlarged manner. FIG. 6 is a flow chart showing an operation of the case of phase adjustment of the frame pulse signal latch circuit.

The frame pulse signal FPIN is the signal which has the pulse width slightly longer than the pulse width of the original frame pulse signal FP (i.e. one-clock cycle). Note that the method of extending the pulse width of the frame pulse signal FPIN to be slightly longer than one-clock cycle will be described later.

Corresponding to input of the initiation directing signal, which indicates initiation of the phase adjustment operation, the control circuit 16 outputs the phase control signal CTL, thereby initializing the phase adjustment amount of the PLL circuit 12 to, for example, zero (step S10). As a result, tle clocks CLK' having a zero phase adjustment amount with respect to the clocks CLK are output from the PLL circuit 12 (step S11).

The flip-flop 13 latches the frame pulse signal FPIN, which is output from the buffer 10, in synchronization with the clock CLK' and outputs the frame pulse signal FPOUT (step S12).

Subsequently, the flip-flop 14 latches the frame pulse signal FPOUT, which is output from the flip-flop 13, in synchronization with the clock CLK'. The output FOUT of the flip-flop 14, which is a result of latching the frame pulse signal FPOUT, is a signal that is shifted by one clock with respect to the frame pulse signal FPOUT (step S13).

The AND circuit 15 carries out an AND operation of the output FPOUT of the flip-flop 13 and the output FOUT of the flip-flop 14 (step S14).

The control circuit 16 determines whether the detection signal of the "H" level is output to the output AOUT of the AND circuit 15 and whether the racing state is generated or not (step 15). When the output AOUT of the AND circuit 15 is not at the "H" level, the control circuit 16 outputs the phase control signal CTL, thereby changing the phase adjustment amount of the PLL circuit 12 by a predetermined unit amount (step S16) and returns to step S12. In this manner, the process of steps S12 to S16 is repeated until the output AOUT of the AND circuit 15 becomes at the "H" level.

Meanwhile, when the output AOUT of the AND circuit 15 becomes at the "H" level (YES in step S15), the control circuit 16 sets the phase adjustment amount, which is obtained by adding or subtracting the amount corresponding to half a cycle of the clock to or from the current phase adjustment amount (worst phase adjustment amount) of the PLL circuit 12, as the optimal phase adjustment amount. Then, the phase control signal CTL is output, thereby setting the phase adjustment amount of the PLL circuit 12 to the optimal phase adjustment amount (step S17). Thus, the phase adjustment operation is finished. Thereafter, the phase adjustment amount of the PLL circuit 12 is fixed to the optimal phase adjustment amount, which has been set in the phase adjustment operation.

As shown in FIG. 5A to FIG. 5F, the output AOUT of the AND circuit 15 becomes at the "H" level when the frame pulse signal FPIN is latched twice in the vicinities of rise of the clocks CLK' by the flip-flop 13. In this case, the phases are related so that the rise/decay timing of the frame pulse signal FPIN and rise timing of the clocks CLK' are synchronized. This phase relation is the worst phase relation wherein the racing state is generated.

Therefore, the phase of rise of the clocks CLK', which have been phase-adjusted based on the phase adjustment amount (optimal phase adjustment amount) obtained by adding or subtracting the amount corresponding to half a cycle of the clock to or from the worst phase adjustment amount is approximately matched with the phase of the center of the significant period length of the frame pulse signal FPIN. Therefore, in the frame pulse signal latch circuit of the present embodiment, a stable latch operation is realized by latching in synchronization with the clocks CLK', which have been adjusted based on the optimal phase adjustment amount. Note that the optimal phase adjustment amount is not required to be set so that the phase of the rise of the clock CLK' and the phase of the center of the significant period length of the frame pulse signal FPIN are approximately matched with each other. The time position of the rise of the clock CLK' is merely required to be set within the latch effective period except for the racing generation range.

Next, the method of extending the pulse width of the frame pulse signal FPIN to the length that is slightly longer than one-clock cycle will be explained.

Figure 7:
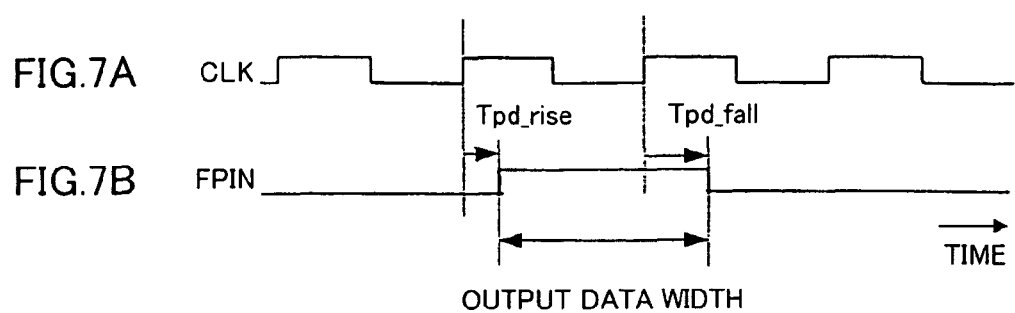
FIG. 7A and FIG. 7B are timing charts for explaining a method of extending the pulse width of the frame pulse signal to a length longer than a one-clock cycle in the second embodiment of the present invention.

In the present embodiment, a method that utilizes simple device characteristics is used. More specifically, when a device that has a time lag between rise and decay of an output signal is used as the buffer 10, the pulse width of the frame pulse signal FPIN output from the buffer 10 can be extended to be slightly longer than one-clock cycle, as is understood when FIG. 7A and FIG. 7B are taken into consideration. In the example of FIG. 207B, decay time Tpd_fall is longer than rise time Tpd_rise of the buffer. Note that such a pulse-width expanding function of the frame pulse signal may be mounted in the transmitting side.

As described above, in the present embodiment, the racing state is generated by sequentially varying the phase adjustment amount of the clocks, and the optimal phase adjustment amount is set based on the worst phase adjustment amount in which the racing state is generated. Without carrying out evaluation or adjustment of the circuit in advance, the timing for latching the frame pulse signal can be automatically and accurately adjusted.

The latch timing is determined by sequentially varying the phase adjustment amount of the clocks. Therefore, the latch timing can be adjusted without being affected by characteristics of individual printed wiring boards or unique characteristics of circuits. As a result, the need for subjecting substrates, circuits, etc. to evaluation or adjustment of phase shift in advance is eliminated, and the workload required for designing, fabrication, quality management, etc. of, for example, printed wiring boards or circuits can be significantly reduced. Particularly, even if a printed wiring board for a high-frequency zone having a high clock frequency is used, restrictions imposed on pattern designing can be extremely reduced.

Moreover, the time that is required until the racing state is detected merely requires, on average, the time that corresponds to a period corresponding to half a cycle of the clocks, in other words, the time required for varying the phase of the clock CLK' by 180 degrees. Therefore, compared with the case in which the period corresponding to one cycle of the clocks is varied, in other words, the phase of the clocks CLK' is varied by 360 degrees, the optimal phase of the clocks for reliably latching the frame pulse signal can be found in a shorter period of time. As a result, the time required for phase adjustment of the clocks can be also shortened.

Moreover, since the racing state is generated merely in a very short period, the worst phase adjustment amount can be uniquely detected. Therefore, an optimal phase point based on rise of the clock which is adjusted based on the worst adjustment amount can be also uniquely determined. Therefore, the phase adjustment can be readily automated. The frame pulse signal latch circuit according to the present embodiment does not need a design restriction in which the phase variation amount upon designing is suppressed to minimum by providing a restriction on the wiring length of the printed wiring board, for example, in order to finish evaluation in short time. Therefore, the degree of freedom of printed wiring board design is expanded.

Third Embodiment

Figure 8:
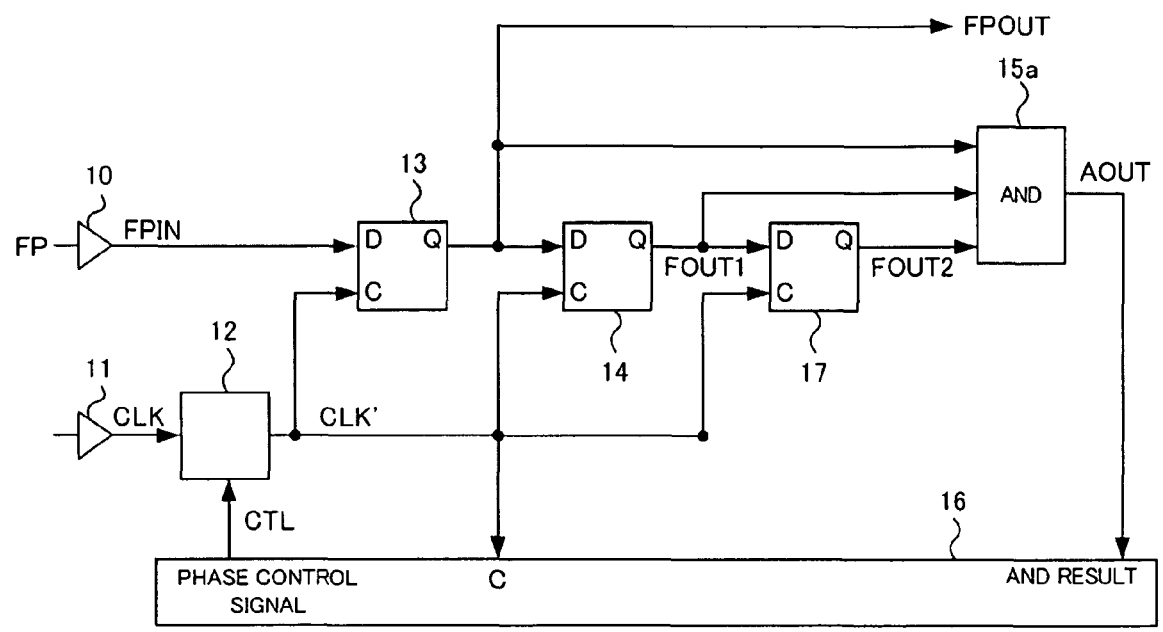
FIG. 8 is a block diagram showing a configuration of a frame pulse signal latch circuit according to a third embodiment of the present invention.
Figure 9:
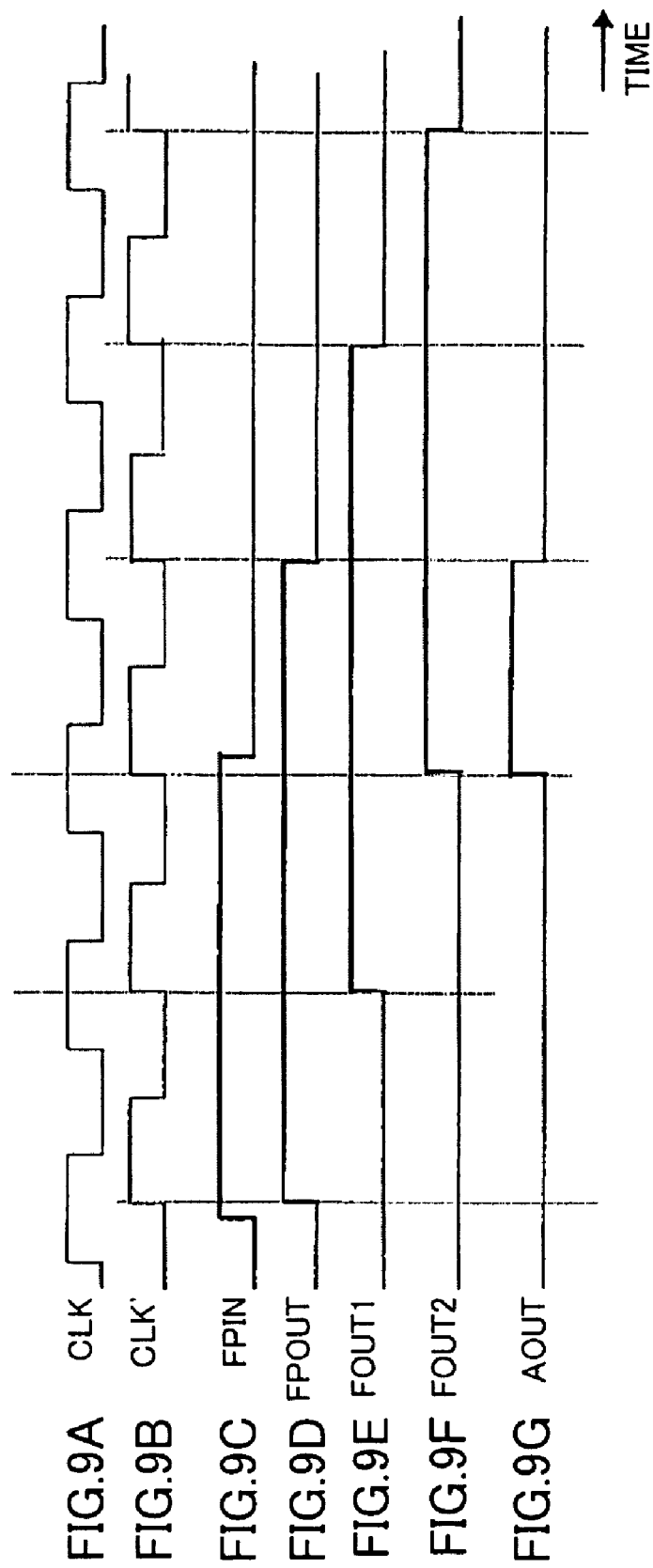
FIG. 9A to FIG. 9G are timing charts for explaining an operation of a case of phase adjustment of the frame pulse signal latch circuit of FIG. 8.

Next, a third embodiment of the present invention will be explained. FIG. 8 is a block diagram showing a configuration of a frame pulse signal latch circuit according to the third embodiment of the present invention. Note that constituents similar to the constituents shown in FIG. 3 are denoted by the same reference numerals. In the present embodiment, the pulse width of the frame pulse signal FP is a two-clock cycle.

The frame pulse signal latch circuit of the present embodiment has the buffers 10 and 11, the PLL circuit 12, the flip-flops 13, 14, and 17, an AND circuit 15a, and the control circuit 16.

The buffer 10 receives the frame pulse signal FP from the transmitting side. The buffer 11 receives clocks from the transmitting side.

The PLL circuit 12 adjusts the phase of the clocks CLK, which is output from the buffer 11, and outputs the adjusted clocks CLK'.

The flip-flop 13 latches the frame pulse signal FPIN, which is output from the buffer 10, in synchronization with the clocks CLK', which is phase-adjusted in the PLL circuit 12, and outputs the frame pulse signal FPOUT. The flip-flop 14 latches the frame pulse signal FPOUT, which is output from the flip-flop 13, in synchronization with the clocks CLK'.

The flip-flop 17 latches output FOUT1 of the flip-flop 14 in synchronization with the clocks CLK'.

The AND circuit 15a carries out an AND operation of the output FOPUT of the flip-flop 13, the output FOUT1 of the flip-flop 14, and output FOUT2 of the flip-flop 17.

The control circuit 16 controls the phase adjustment amount of the PLL circuit 12 based on the output AOUT of the AND circuit 15a.

Figure 10:
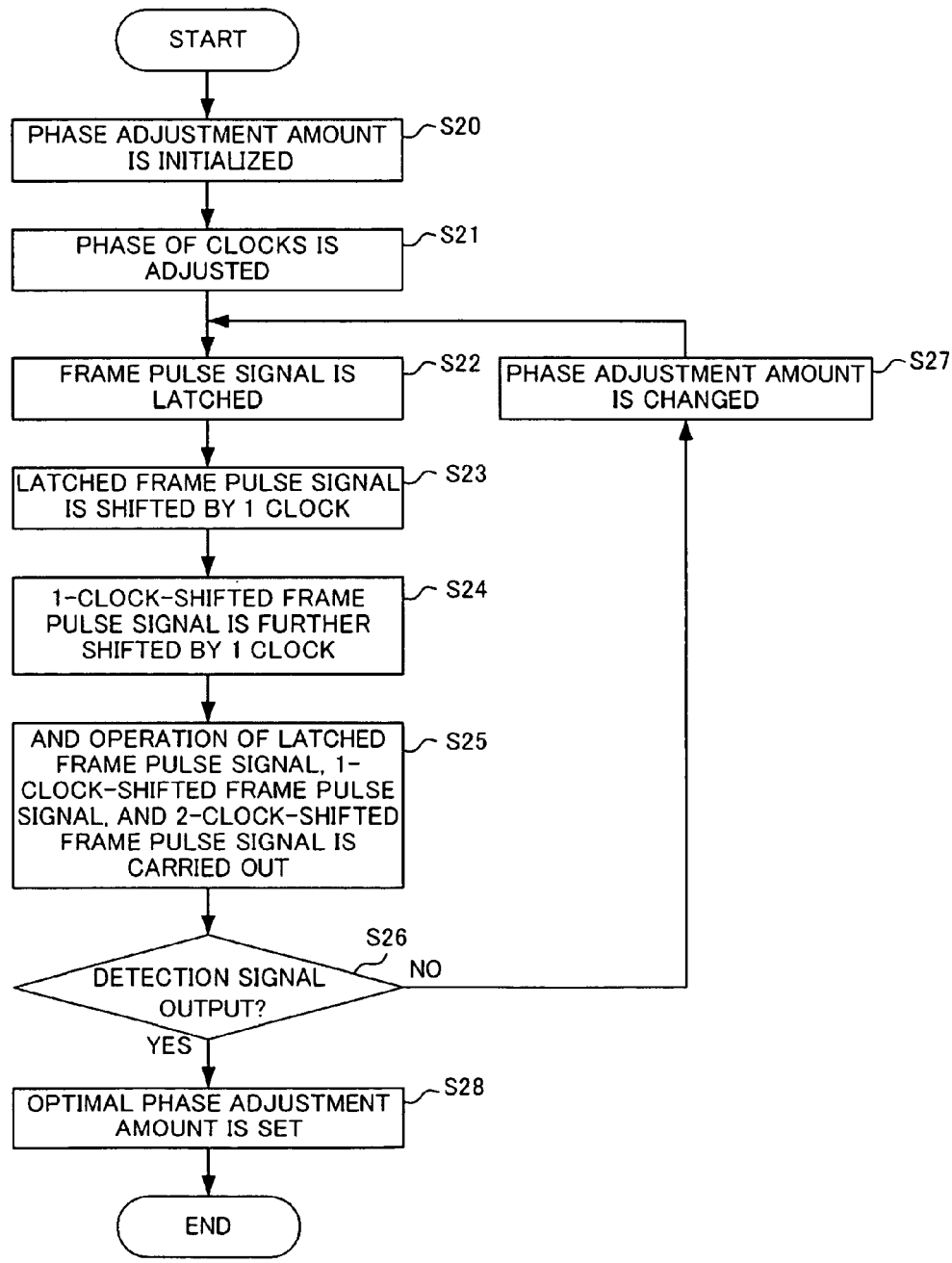
FIG. 10 is a flow chart showing the operation of the case of phase adjustment of the frame pulse signal latch circuit of FIG. 8.

Next, an operation of the frame pulse signal latch circuit of the present embodiment will be explained. FIG. 9A to FIG. 9G are timing charts for explaining the operation of the frame pulse signal latch circuit. FIG. 10 is a flow chart showing the operation of the frame pulse signal latch circuit.

The frame pulse signal FPIN of the present embodiment is a signal that has a pulse width slightly longer than the pulse width of the original frame pulse signal FP (i.e. two-clock cycle). The frame pulse signal FPIN having the length slightly longer than the two-clock cycle means to a frame pulse signal having a minimum length which can be latched by three clocks. Expansion of such frame pulse signal can be realized as well as the second embodiment.

Corresponding to input of an initiation directing signal indicating initiation of a phase adjustment operation, the control circuit 16 initializes the phase adjustment amount of the PLL circuit 12 to, for example, zero (step S20). As a result, the clocks CLK' having a zero phase adjustment amount with respect to the clocks CLK are output from the PLL circuit 12 (step S21).

The flip-flop 13 latches the frame pulse signal FPIN, which is output from the buffer 10, in synchronization with the clocks CLK' and outputs the frame pulse signal FPOUT (step S22).

Subsequently, the flip-flop 14 latches the frame pulse signal FPOUT, which is output from the flip-flop 13, in synchronization with the clocks CLK'. The output FOUT1 of the flip-flop 14, which is obtained by latching the frame pulse signal FPOUT, is a signal that is shifted by one clock with respect to the frame pulse signal FPOUT (step S23).

The flip-flop 17 latches the output FOUT1 of the flip-flop 14 in synchronization with the clocks CLK'. The output FOUT2 of the flip-flop 17 is a signal that is shifted by two clocks with respect to the frame pulse signal FPOUT (step S24).

The AND circuit 15a carries Out an AND operation of the output FPOUT of the flip-flop 13, the output FOUT1 of the flip-flop 14, and the output FOUT2 of the flip-flop 17 (step S25).

The control circuit 16 determines whether a detection signal of the "H" level is output to the output AOUT of the AND circuit 15a and the racing state is generated or not (step S26). When the output AOUT of the AND circuit 15a is not at the "H" level, the control circuit 16 changes the phase adjustment amount of the PLL circuit 12 by a predetermined unit amount by outputting the phase control signal CTL (step S27) and returns to step S22. In this manner, the process of steps S22 to S27 is repeated until the output AOUT of the AND circuit 15a becomes at the "H" level.

Meanwhile, when the output AOUT of the AND circuit 15a becomes at the "H" level (YES in step S26), the control circuit 16 sets the phase adjustment amount, which is obtained by adding or subtracting the amount corresponding to half a cycle of the clock to or from the current phase adjustment amount (worst phase adjustment amount) of the PLL circuit 12, as the optimal phase adjustment amount. Then, the phase adjustment amount of the PLL circuit 12 is set to the optimal phase adjustment amount by outputting the phase control signal CTL (step S28). Thus, the phase adjustment operation is finished. Thereafter, the phase adjustment amount of the PLL circuit 12 is fixed to the optimal phase adjustment amount, which has been set in the phase adjustment operation.

As is understood when FIG. 9A to FIG. 9G are taken into consideration, the output AOUT of the AND circuit 15a becomes at the "H" level when the frame pulse signal FPIN is latched three times by the flip-flop 13. In this case, the phases are related so that the rise/decay timing of the frame pulse signal FPIN and the rise timing of the clocks CLK' are synchronized. This phase relation is the worst phase relation wherein the racing state is generated.

Therefore, the phase of the rise of the clocks CLK', which have been phase-adjusted based on the phase adjustment amount (optimal phase adjustment amount) obtained by adding, or subtracting the amount corresponding to half a cycle of the clock to or from the worst phase adjustment amount, is included in a significant period length of the frame pulse signal FPIN. Therefore, in the frame pulse signal latch circuit of the present embodiment, a stable latch operation is realized by latching in synchronization with the clocks CLK', which have been adjusted based on the optimal phase adjustment amount.

As explained above, even when the pulse width of the frame pulse signal is a two-clock cycle, similar effects as the second embodiment can be obtained.

Fourth Embodiment

The above described embodiments are explained by taking the case in which the frame pulse signal is transferred between different printed wiring boards or devices as an example. The present invention can be also applied to the case in which a plurality of data signals are to be transferred. Hereinafter, a fourth embodiment of the present invention will be explained.

Figure 11:
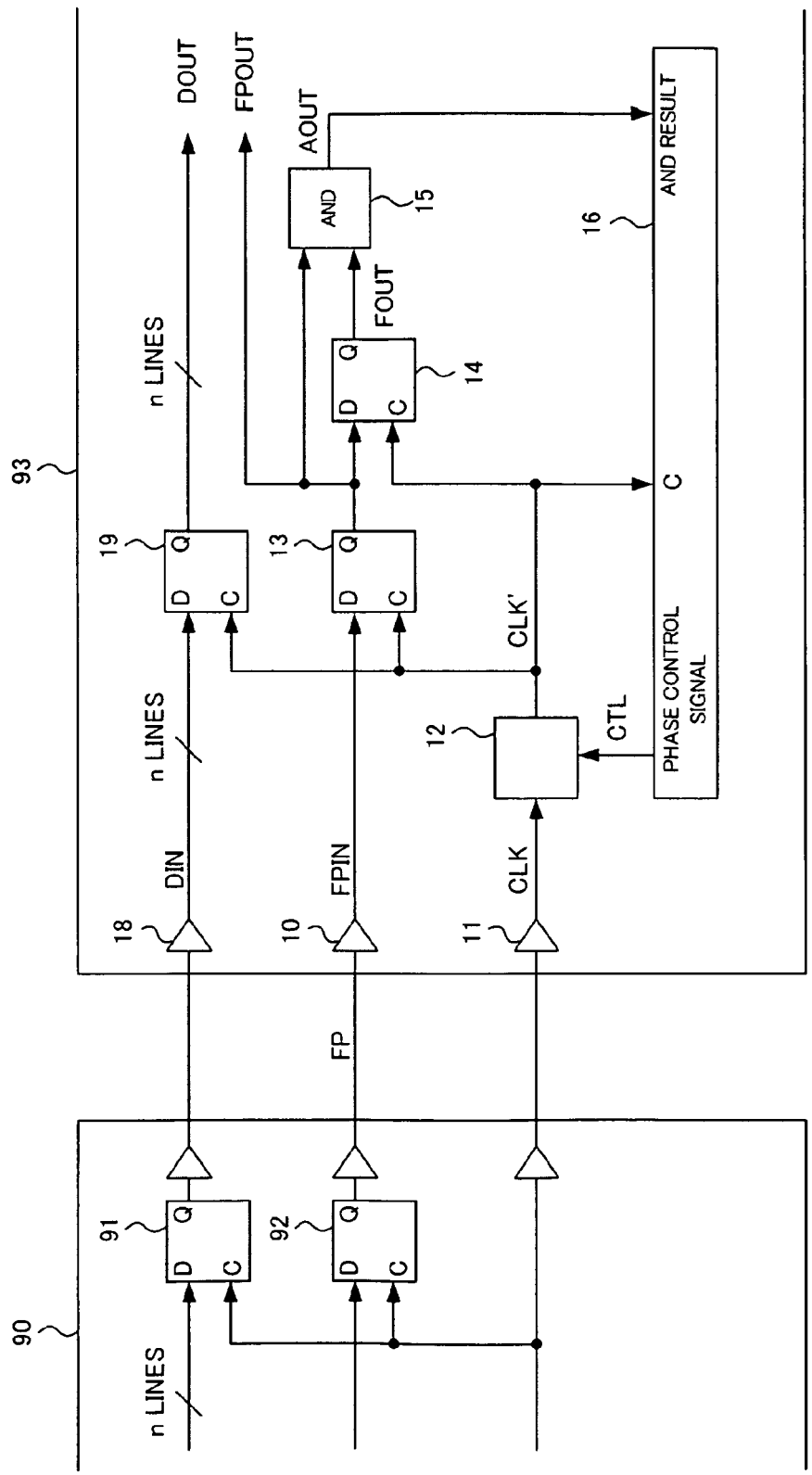
FIG. 11 is a block diagram showing a configuration of a frame pulse signal latch circuit according to a fourth embodiment of the present invention.

FIG. 11 is a block diagram showing a constitution of a frame pulse latch circuit according to the fourth embodiment of the present invention. Note that the constituents equivalent to the constituents shown in FIG. 3 are denoted by the same reference numerals.

In the present embodiment, in a unit 90 of a transmitting side, the data signals are latched by a flip-flop 91 in synchronization with the clocks, and a frame pulse signal is latched by a flip-flop 92 in synchronization with the clocks. Then, the data signals of n lines, the frame pulse signal, and the clocks are transmitted to a unit 93 of a receiving side.

The frame pulse signal latch circuit of the unit 93 of the receiving side carries out an operation similar to that of the frame pulse signal latch circuit explained in the second embodiment. A flip-flop 19 of the frame pulse signal latch circuit latches the data signals DIN, which are received by a buffer 18, in synchronization with the clocks CLK' and outputs data signals DOUT.

In the present embodiment, with respect to the frame pulse signal of one line, the data signals of the n lines are output to the unit 93 of the receiving side in the state that they are synchronized by the same clocks. Then, in the unit 93 of the receiving side, the receiving-side clocks are subjected to phase optimization by using the frame pulse signal. As a result, in the unit 93 of the receiving side, the latch timing of the parallelly-transmitted data signals is optimized, and the data signals of the plurality of lines are accurately latched.

As explained above, in the present embodiment, the multi-bit data signals can be reliably transmitted.

Note that, in the present embodiment, the case in which the pulse width of the frame pulse signal is a one-clock cycle is explained; however, it goes without saying that the embodiment can be also applied to the case in which the pulse width of the frame pulse signal is equal to or more than a two-clock cycle.

Fifth Embodiment

Figure 12:
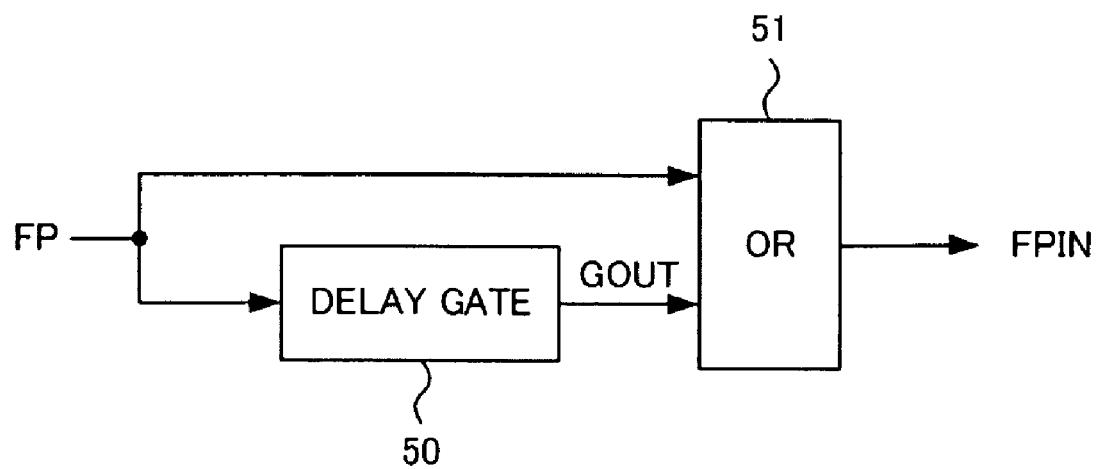
FIG. 12 is a block diagram showing a configuration of a pulse-width expanding unit according to a fifth embodiment of the present invention.

Next, a fifth embodiment of the present invention will be explained. FIG. 12 is a block diagram showing a configuration of a pulse-width expanding unit according to the fifth embodiment of the present invention.

In the second embodiment, the buffer 10 is used as the pulse-width expanding unit; however, the buffer expanding unit can comprise a delay gate 50, which delays the input frame pulse signal FP, and an OR circuit 51 which outputs the result of a logical addition of the output GOUT of the delay gate 50 and the input frame pulse signal FP as the frame pulse signal FPIN.

Figure 13:
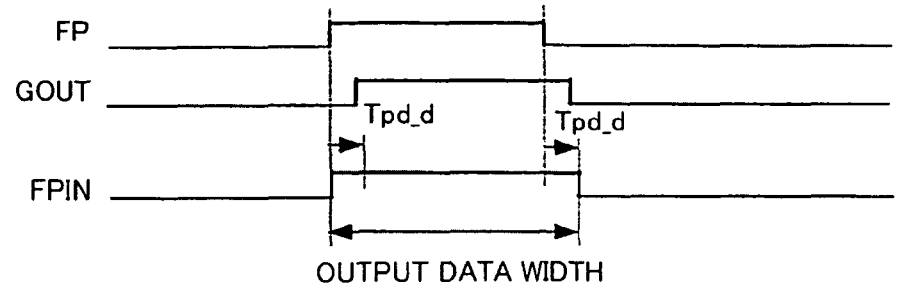
FIG. 13A to FIG. 13C are timing charts for explaining an operation of the pulse-width expanding unit of FIG. 12.

As is understood when the timing charts shown in FIG. 13A to FIG. 13C are taken into consideration, the input frame pulse signal FP is delayed by the delay gate 50 by a delay amount Tpd_d. Next, a logical addition of the delayed signal GOUT and the input frame pulse signal FP is carried out. As a result, the pulse width can be expanded, and the frame pulse signal FPIN can be generated.

Sixth Embodiment

Figure 14:
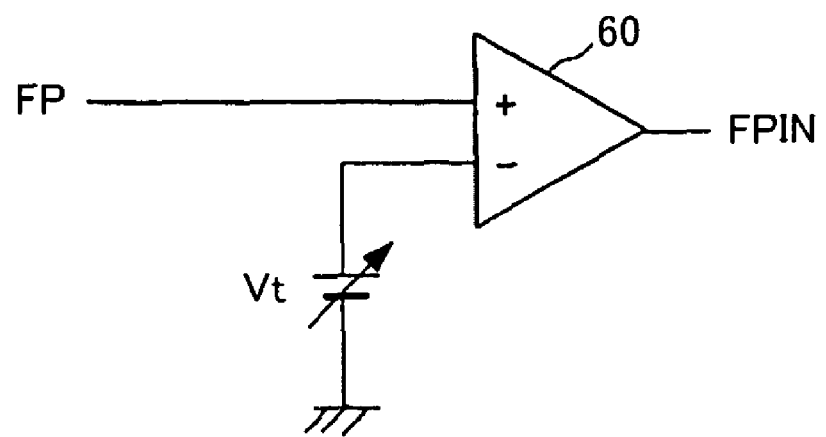
FIG. 14 is a block diagram showing a configuration of a pulse-width expanding unit according to a sixth embodiment of the present invention.

Next, a sixth embodiment of the present invention will be explained. FIG. 14 is a block diagram showing a configuration of a pulse-width expanding unit according to the sixth embodiment of the present invention.

Figure 15A:
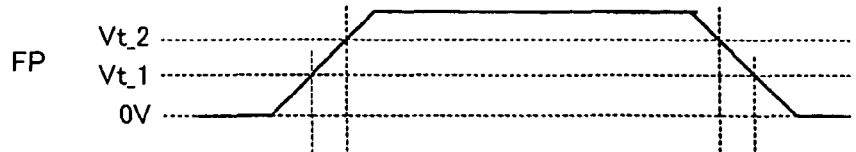
FIG. 15A to FIG. 15C are timing charts for explaining an operation of the pulse-width expanding unit of FIG. 14.
Figure 15B:
Figure 15C:

In the present embodiment, a differential buffer 60 is used as a buffer expanding unit. As is understood when the timing charts shown in FIG. 15A to FIG. 15C are taken into consideration, the pulse width of the frame pulse signal FPIN can be changed by adjusting a threshold voltage Vt of the differential buffer 60.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A frame pulse signal latch circuit comprising:

a pulse-width expanding unit which outputs a frame pulse signal which is obtained by expanding a pulse width of an input frame pulse signal which has the pulse width of an m (m is a positive integer) -clock cycle to a pulse width which is slightly longer than the m-clock cycle;

a phase adjustment unit which generates an output clock by adjusting a phase of an input clock based on a directed phase adjustment amount;

a first latch unit which obtains an output frame pulse signal by latching the frame pulse signal, which is output from the pulse-width expanding unit, in synchronization with the output clock;

a racing detection unit which generates signals including a signal shifted by one clock to a signal shifted by m clocks with respect to the output frame pulse signal and detects a racing state, which is generated in the output frame pulse due to a phase relation between the frame pulse signal, which is output from the pulse-width expanding unit, and the output clock, based on a result of an AND operation of the output frame pulse signal and the signals including the one-clock shifted signal to the m-clock shifted signal; and a control unit which sequentially selects and directs different phase adjustment amounts to the phase adjustment unit, determines an optimal phase adjustment amount based on a worst phase adjustment amount of the case in which the racing state is detected by the racing detection unit, and gives a direction about the optimal phase adjustment amount to the phase adjustment unit.

2. The frame pulse signal latch circuit according to claim 1, wherein the racing detection unit comprises an m-unit of a second latch unit which generates the signals including the one-clock shifted signal to the m-clock shifted signal with respect to the output frame pulse signal of the first latch unit; and an AND operation unit which carries out an AND operation of the output frame pulse signal and the signals including the one-clock shifted signal to the m-clock shifted signal.

3. The frame pulse signal latch circuit according to claim 1, wherein the control unit sets a phase adjustment amount, which is shifted by 180 degrees from the worst phase adjustment amount, as the optimal phase adjustment amount.

4. The frame pulse signal latch circuit according to claim 1, wherein the frame pulse signal output from the pulse-width expanding unit is a frame pulse signal having a minimum length which can be latched by a (m+1) clocks.

5. The frame pulse signal latch circuit according to claim 4, wherein the pulse-width expanding unit comprises a buffer to which the input frame pulse signal is input.

6. The frame pulse signal latch circuit according to claim 4, wherein the pulse-width expanding unit comprises a delay gate which delays the input frame pulse signal; and a logical addition unit which carries out a logical addition of the output of the delay gate and the input frame pulse signal.

7. The frame pulse signal latch circuit according to claim 4, wherein
the pulse-width expanding unit comprises
a differential buffer having an input terminal to which the input frame pulse signal is input and another input terminal to which a threshold voltage is input.

8. A phase adjustment method of a frame pulse signal latch circuit including:
a pulse-width expanding procedure of outputting a frame pulse signal which is obtained by expanding a pulse width of an input frame pulse signal which has the pulse width of an m (m is a positive integer) -clock cycle to a pulse width which is slightly longer than the m-clock cycle;
a phase adjustment procedure of generating an output clock adjusting a phase of an input clock based on a directed phase adjustment amount by a phase adjustment unit;
a first latch procedure of obtaining an output frame pulse signal by latching the frame pulse signal, which is output in the pulse-width expanding procedure, in synchronization with the output clock;
a racing detection procedure of generating signals including a signal shifted by one clock to a signal shifted by m clocks with respect to the output frame pulse signal and detecting a racing state, which is generated in the output frame pulse due to a phase relation between the frame pulse signal, which is output in the pulse-width expanding procedure, and the output clock, based on a result of an AND operation of the output frame pulse signal and the signals including the one-clock shifted signal to the m-clock shifted signal; and
a control procedure of sequentially selecting and directing different phase adjustment amounts to the phase adjustment unit, determining an optimal phase adjustment amount based on a worst phase adjustment amount of the case in which the racing state is detected in the racing detection procedure, and giving a direction about the optimal phase adjustment amount to the phase adjustment unit.

9. The phase adjustment method of the frame pulse signal latch circuit according to claim 8, wherein
the racing detection procedure includes
an m step of a second latch procedure which generates the signals including the one-clock shifted signal to the m-clock shifted signal with respect to the output frame pulse signal of the first latch procedure; and
an AND operation procedure which carries out an AND operation of the output frame pulse signal and the one- to m clock shifted signals.

10. The phase adjustment method of the frame pulse signal latch circuit according to claim 8, wherein
the control procedure sets a phase adjustment amount, which is shifted by 180 degrees from the worst phase adjustment amount, as the optimal phase adjustment amount.

11. The phase adjustment method of the frame pulse signal latch circuit according to claim 8, wherein
the frame pulse signal output in the pulse-width expanding procedure is a frame pulse signal having a minimum length which can be latched by a (m+1) clocks.

* * * * *